(12) United States Patent
Nazarian

(10) Patent No.: US 10,279,645 B1
(45) Date of Patent: May 7, 2019

(54) DEVICE TO PREVENT A COMPUTING UNIT FROM OVERHEATING

(71) Applicant: Jon Nazarian, Sunland, CA (US)

(72) Inventor: Jon Nazarian, Sunland, CA (US)

( * ) Notice: Subject to any disclaimer, the term of this patent is extended or adjusted under 35 U.S.C. 154(b) by 0 days.

(21) Appl. No.: 15/917,910

(22) Filed: Mar. 12, 2018

(51) Int. Cl.
| | | |
|---|---|---|
| *B60H 1/00* | (2006.01) | |
| *G06F 1/20* | (2006.01) | |
| *B60R 11/00* | (2006.01) | |
| *H05K 5/02* | (2006.01) | |
| *B60R 11/04* | (2006.01) | |
| *B60R 11/02* | (2006.01) | |
| *H04B 1/3888* | (2015.01) | |
| *H04B 1/3822* | (2015.01) | |

(52) U.S. Cl.
CPC ..... *B60H 1/00264* (2013.01); *B60H 1/00271* (2013.01); *B60H 1/00564* (2013.01); *B60R 11/0241* (2013.01); *B60R 11/0252* (2013.01); *B60R 11/04* (2013.01); *H04B 1/3822* (2013.01); *H04B 1/3888* (2013.01); *H05K 5/0204* (2013.01); *B60R 2011/007* (2013.01); *B60R 2011/0008* (2013.01); *B60R 2011/0071* (2013.01); *B60R 2011/0077* (2013.01); *G06F 1/20* (2013.01)

(58) Field of Classification Search
CPC ............ B60H 1/00264; B60H 1/00564; B60H 1/00271; H05K 5/0204; B60R 11/04; B60R 11/0252; B60R 11/0241; B60R 2011/0071; B60R 2011/0077; B60R 2011/007; B60R 2011/0008; H04B 1/3822; H04B 1/3888; G06F 1/20; G06F 1/203

USPC ........................ 361/679.46–679.54, 688–723
See application file for complete search history.

(56) References Cited

U.S. PATENT DOCUMENTS

| | | | | |
|---|---|---|---|---|
| 5,355,694 A | * | 10/1994 | Morrow ................. | B60N 3/104 62/244 |
| 6,884,159 B1 | * | 4/2005 | Ferraud, Jr. ........ | B60H 1/00592 454/119 |
| 6,902,473 B1 | * | 6/2005 | Goobeck ............ | B60H 1/00564 454/127 |
| 7,062,300 B1 | | 6/2006 | Kim | |
| D529,713 S | * | 10/2006 | Guyot ............................ | D3/218 |
| D765,064 S | * | 8/2016 | Wengreen ................. | D14/238.1 |
| 9,610,376 B2 | * | 4/2017 | Esses ......................... | A61L 9/03 |
| 9,641,207 B1 | * | 5/2017 | Bevers ................. | H04B 1/3877 |
| 2013/0273824 A1 | * | 10/2013 | Lang .................. | H05K 7/20863 454/141 |
| 2014/0262850 A1 | | 9/2014 | Kolton | |

* cited by examiner

*Primary Examiner* — Zachary Pape
(74) *Attorney, Agent, or Firm* — Sanchelima & Associates, P.A.; Christian Sanchelima; Jesus Sanchelima

(57) ABSTRACT

Disclosed is a device to be utilized in a vehicle to prevent a computing unit from overheating. The device includes a holder having a plurality of air vents, a plastic flexible hose, a shade, a reducer, and a plurality of alligator clips. The reducer is mounted on an air conditioning (AC) vent by utilizing the plurality of alligator clips. The holder includes a front portion and rear portion to accommodate the computing unit. The reducer is mounted in a way to guide the cool air to the plurality of air vents of the holder through the plastic flexible hose. The plurality of air vents is configured at a front portion of the holder to prevent the battery of the computing unit from overheating. Further, the shade is configured on a top portion of the holder to protect the computing unit from the sun.

10 Claims, 2 Drawing Sheets

DEVICE TO PREVENT A COMPUTING UNIT FROM OVERHEATING

TECHNICAL FIELD

The presently disclosed embodiments are related, in general, to a device to prevent a computing unit from overheating. More particularly, the presently disclosed embodiments are related to a device to be utilized in a vehicle to prevent the computing unit from overheating and shutting down while operation.

BACKGROUND

With the development of telecommunication technology and electronic commerce, the computing units such as mobile phones have become an important part of people's lives. These computing units accommodate various software applications such as google maps, and messaging applications to accomplish their corresponding objectives. Frequent usage of these software applications leads to the high power/battery consumption and further result into overheated battery. If the heat can not dissipate as quickly as possible, it affects the stability of the computing unit and can lead to the damages not only to the computing unit but to the user as well. Further overheating of the mobile phone leads to the serious impact on the user experience and often cause a breakdown.

Although, the overheating is not always due to the excessive usage of the software applications the ambient temperature can also affect the battery. The existing mobile phones may not be able to absorb the heat due to hot weather. The hot weather affects the mobile phone's internal temperature which leads to a faster battery drainage, melted central processing unit, and battery or causing a forced shutdown of the mobile phone. When the mobile phone is overheated, there are no guarantees that the mobile phone will be able to restart.

Further, the utilization of the GPS for navigation also causes the heat up. since the more the cell phone's CPU works, the more it tends to heat up. When using GPS, the mobile phone makes heavy use of its resources and uses the internal circuits for 100% of the time, with the screen on and connected to the internet. Mostly the drivers and the delivery people are affected by this heating issues of the mobile phone because they have to continuously monitor the route to reach the desired location.

Various types of devices and cell phone holders are known in the art which are utilized by the users while driving. The U.S. Pat. No. 7,062,300 B1 discloses a cell phone holding and charging device for a vehicle dashboard having an upper surface. This patent provides a device which is capable of use within a vehicle, and, in particular, to hold and power cell phones.

The Chinese patent application CN 105323344 A talks about a holder for mobile phones used in the vehicle. The holder includes retaining clips, screws, nuts, fixed base, fixed pole, cap, rotating ball, universal clip. The fixed clip snaps, screws, and nuts fixedly connected to the fixed base and the retaining clips and the connecting rod fixed to the fixed base. The connecting rod cap, the rotating head and the ball cap connected to the universal clip connection with the rotation of the ball head.

The U.S. patent application publication number 2014/0262850 discloses an improved mobile device attachment apparatus which includes a panel member that affixes to peripheral hardware for a mobile device, such as a battery pack, amplifier and digital to analog converter, or even a wallet having pockets for holding wallet-sized cards, and a case member which partially encloses a mobile device, such as an audio player, cell phone, or similar personal electronic apparatus.

The Chinese patent application CN 105323344 A talks about a rapid heating and cooling reminder function mobile phone board and having a rapid cooling and heating phone alerts.

The Chinese patent application CN 204350092 U talks about a battery when overheated, can automatically disconnect power to protect the cell phone battery is damaged, avoid property damage and personal injury can be prevented phone batteries overheating bracket.

However, the aforementioned prior arts have several drawbacks. The prior art devices do not disclose about a modular device which can be configurable to attach to the air conditioning (AC) vent of the vehicle. Further, the existing cell phone holders are not meant to utilize the AC vent to keep the temperature of the mobile phone in control and are not convenient to the driver. Therefore there is a need for a device to be utilized in a vehicle to prevent the computing unit from overheating and shutting down while operation. Further, there is also a need for a device which can be detachably attached to the AC vent of the vehicle.

Further limitations and disadvantages of conventional and traditional approaches will become apparent to one of skill in the art, through comparison of described systems with some aspects of the present disclosure, as set forth in the remainder of the present application and with reference to the drawings.

SUMMARY

According to embodiments illustrated herein, there may be provided a device to prevent a computing unit from overheating. The device includes a holder having a plurality of air vents, a plastic flexible hose, a shade, a reducer, and a plurality of alligator clips. The reducer is mounted on an air conditioning (AC) vent by utilizing the plurality of alligator clips. The holder includes a front portion and rear portion to accommodate the computing unit. The reducer is mounted in a way to guide the cool air to the plurality of air vents of the holder through the plastic flexible hose. The plurality of air vents is configured at a front portion of the holder to prevent the battery of the computing unit from overheating.

In an aspect, the present device includes an air duct and a shade which is configured on a top portion of the holder to protect the computing unit from the direct sunlight. Additionally, the shade enhances the display screen visibility by preventing sun glare.

In an aspect, the principal object of the present invention is to provide a compact and efficient device to be utilized in a vehicle to prevent the computing unit from overheating and shutting down while operation.

It is a further object of the present invention is to provide a modular, inexpensive, and easy to install a device to protect the computing unit. Examples of the computing unit include, but are not limited to, a smartphone, a personal computer, a laptop, a personal digital assistant (PDA), a mobile device, a tablet, or iPad.

It is a further object of the present invention is to provide a device which can be utilized by the various users who uses navigation system (GPS) while driving. Examples of the users include but not limited to cab drivers, delivery people, and the general public who use navigation system.

It is a further object of the present invention is to provide a device which can transfer cool air from the vehicle's AC vent to any location on the windshield where there is a little or no cooling air. Additionally, the present invention can also be utilized on the dashboard cameras.

These features and advantages of the present disclosure may be appreciated by reviewing the following description of the present disclosure, along with the accompanying figures wherein like reference numerals refer to like parts.

BRIEF DESCRIPTION OF DRAWINGS

The accompanying drawings illustrate the various embodiments of systems, methods, and other aspects of the disclosure. Any person with ordinary skill in the art will appreciate that the illustrated element boundaries (e.g., boxes, groups of boxes, or other shapes) in the figures represent one example of the boundaries. In some examples, one element may be designed as multiple elements, or multiple elements may be designed as one element. In some examples, an element shown as an internal component of one element may be implemented as an external component in another and vice versa. Further, the elements may not be drawn to scale.

Various embodiments will hereinafter be described in accordance with the appended drawings, which are provided to illustrate and not to limit the scope in any manner, wherein similar designations denote similar elements, and in which.

DETAILED DESCRIPTION

The present disclosure may be best understood with reference to the detailed figures and description set forth herein. Various embodiments are discussed below with reference to the figures. However, those skilled in the art will readily appreciate that the detailed description given herein with respect to the figures are simply for explanatory purposes as the methods and systems may extend beyond the described embodiments. For example, the teachings presented and the needs of a particular application may yield multiple alternative and suitable approaches to implement the functionality of any detail described herein. Therefore, any approach may extend beyond the particular implementation choices in the following embodiments described and shown.

References to "one embodiment," "at least one embodiment," "an embodiment," "one example," "an example," "for example," and so on indicate that the embodiment(s) or example(s) may include a particular feature, structure, characteristic, property, element, or limitation but that not every embodiment or example necessarily include that particular feature, structure, characteristic, property, element, or limitation. Further, repeated use of the phrase "in an embodiment" does not necessarily refer to the same embodiment.

Figure 1:
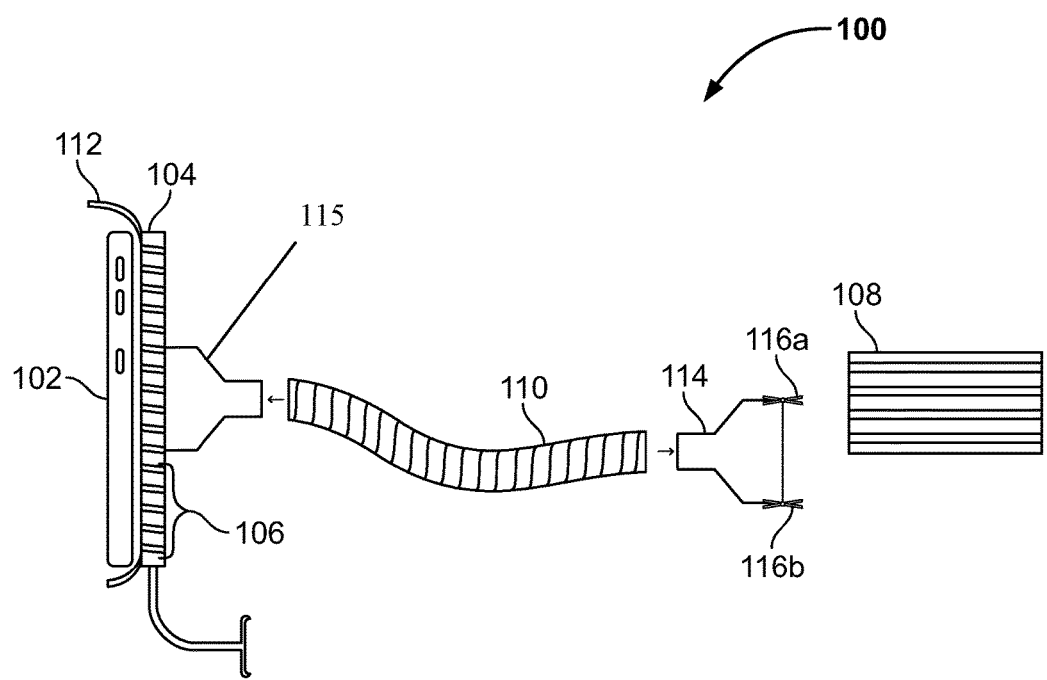
FIG. 1 illustrates the present device to prevent the computing unit from overheating, in accordance with at least one embodiment.

FIG. 1 illustrates the present device 100 to prevent the computing unit 102 from overheating, in accordance with at least one embodiment. The device 100 includes a holder 104 having a plurality of air vents 106, a plastic flexible hose 110, a shade 112, a reducer 114, and a plurality of alligator clips 116a, and 116b. The reducer 114 is mounted on an air conditioning (AC) vent 108 by utilizing the plurality of alligator clips 116a, and 116b. The alligator clips 116a, and 116b provides a detachable connection between the reducer 114 and AC vent 108.

The present device 100 utilizes vehicle's air conditioning (AC) vent 108 to accomplish the objective of the present invention. The holder 104 includes a front portion and rear portion to accommodate the computing unit 102. In an exemplary embodiment, the shapes of the holder 104 include but not limited to rectangular, square etc.

Figure 2:
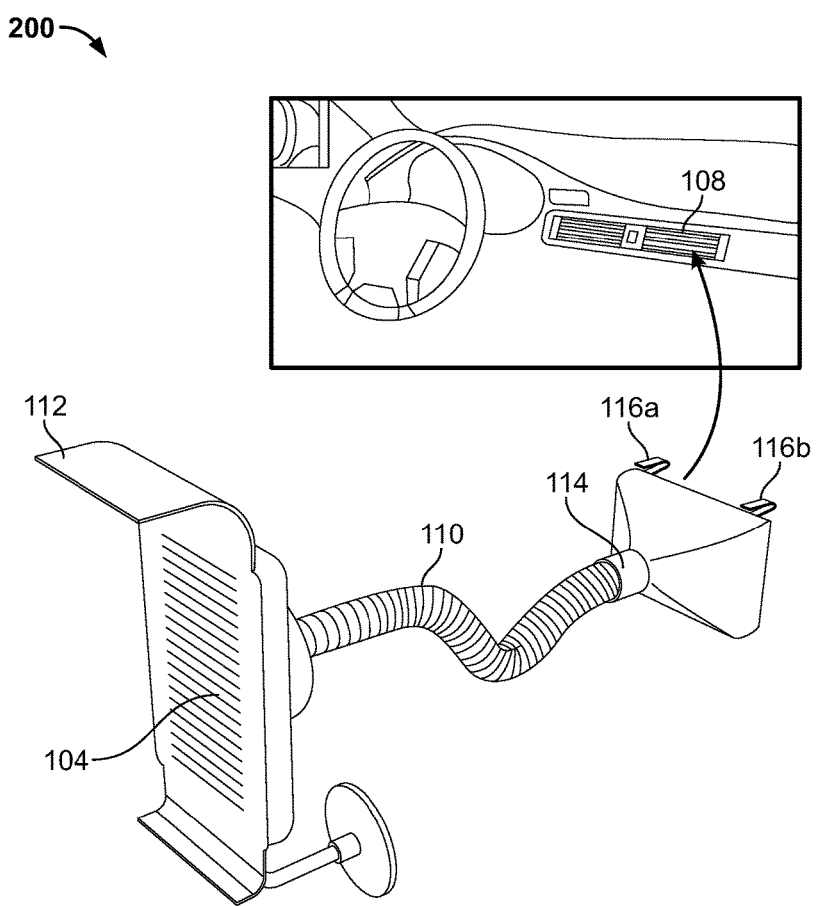
FIG. 2 illustrates an operational view of the present device to prevent the computing unit from overheating, in accordance with at least one embodiment.

FIG. 2 illustrates an operational view 200 of the present device to prevent the computing unit from overheating, in accordance with at least one embodiment. The reducer 114 is mounted in a way to guide the cool air to the plurality of air vents 106 of the holder 104 through the plastic flexible hose 110. The plastic flexible hose 110 is a hollow tube designed to carry cold air from the AC vent 108 to the air vents 106. The plurality of air vents 106 is configured at a front portion of the holder 104 to prevent the battery of the computing unit 102 from overheating. Further, the plastic flexible hose 110 acts as an expander port 115 to evenly distribute the cooling air to surround the rear portion and sides of the computing unit. Additionally, the plastic flexible hose 110 may be detached or cut by the users to the desired length and mount the holder 104 anywhere on the windshield of the vehicle. In an embodiment, the holder 104 can be produced in a color to further minimize the heat absorption.

In an embodiment, the present device 100 includes an air duct and a shade 112 which is configured to a top portion of the holder 104 to protect the computing unit 102 from the direct sunlight. Further, the shade 112 allows the display screen of the computing unit to be easily viewed in bright sunlight and enhances the display screen visibility by preventing sun glare. The air duct provides the pathways for heated air to travel outside the mobile phone. In an exemplary embodiment, the present device 100 can be made of a polymeric material such as plastic.

Thus the present invention provides a compact and efficient device 100 to be utilized in a vehicle to prevent the computing unit 102 from overheating and shutting down while operation. Further, the present invention can be utilized by pizza delivery people, cab drivers, and the general public who are facing the problem of overheating during using the navigation system. The present invention helps a computing unit such as smartphones 102 to function properly and not to shut down while in use in a vehicle. Generally, the smartphones holders are attached to the windshields of cars and they are exposed to direct sunlight which causes overheating especially when other applications are running within the computing unit 102. The present invention provides an aid in keeping the smartphones in a cool and healthy condition so the processing unit functions efficiently. Furthermore, the present invention keeps the cell phones at normal operating temperature without utilizing an external source such as fans or batteries. Additionally, the present invention does not require any tools or equipment for installation. Then the present device may transfer cool air from the vehicle's AC vent to any location on the windshield where there is a little or no cooling air. Additionally, the present device can also be utilized on the dashboard cameras.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not is limited to the particular embodiment disclosed, but that the present disclosure will include all embodiments falling within the scope of the appended claims.

What is claimed is:

1. A device to cool portable electronic devices, comprising:
   a. A mobile device;
   b. A holder adapted to receive and secure said mobile device;
   c. Said holder having a front side, a rear side, a bottom end, and a top end;
   d. Said holder having a plurality of air vents adapted to transfer cool air into the holder and allow hotter air from said mobile device to ventilate;
   e. A hose having an expander port at a first distal end coupled to said rear side, said hose having a second distal end;
   f. Said expander port having a taller end and a shorter end, said shorter end is connected to said hose, said taller end is connected to said rear side;
   g. A shade member mounted to said top end extending forward from said front side away from said hose, said shade extending a sufficient distance to prevent sun glare;
   h. A reducer having a larger end and an opposite smaller end, said reducer having a plurality of fasteners;
   j. An air conditioning vent connected to said reducer's larger end using said fasteners; and
   k. said hose's second distal end connected to said smaller end, said hose is adapted to guide cool air from said air conditioning vent to said expander port, said cool air is then transferred to said plurality of air vents from said expander port.

2. The device to cool portable electronic devices of claim 1 wherein said mobile device is a tablet, a phone, or a laptop.

3. The device to cool portable electronic devices of claim 1 wherein said hose is flexible.

4. The device to cool portable electronic devices of claim 1 wherein said shade is curved.

5. The device to cool portable electronic devices of claim 1 wherein a second shade is mounted to said bottom side.

6. The device to cool portable electronic devices of claim 1 wherein said hose can be adjusted in length.

7. The device to cool portable electronic devices of claim 1 wherein said mobile device is a dashboard camera.

8. The device to cool portable electronic devices of claim 1 wherein said fasteners are alligator clips.

9. The device to cool portable electronic devices of claim 1 wherein said mobile device is mounted to said holder's front side using an adhesive, hook and loop fasteners, magnets, or pressure from said top and bottom end squeezing against said mobile device.

10. The device to cool portable electronic devices of claim 1 wherein said holder is made of plastic.

* * * * *